United States Patent
Pandhumsoporn et al.

(10) Patent No.: US 6,383,938 B2
(45) Date of Patent: *May 7, 2002

(54) METHOD OF ANISOTROPIC ETCHING OF SUBSTRATES

(75) Inventors: Tamarak Pandhumsoporn, Fremont; Kevin Yu, San Jose; Michael Feldbaum, Fremont, all of CA (US); Michel Puech, Annccy Cedex (FR)

(73) Assignee: Alcatel, Paris (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,100

(22) Filed: Apr. 21, 1999

(51) Int. Cl.[7] .............................................. H01L 21/302
(52) U.S. Cl. ......................... 438/706; 438/714; 438/719
(58) Field of Search ................................ 438/700, 701, 438/707, 706, 712, 714, 719, 734, 735

(56) References Cited

U.S. PATENT DOCUMENTS

| | | | |
|---|---|---|---|
| 4,666,555 A | * | 5/1987 | Tsang ........................... 438/719 |
| 4,698,128 A | * | 10/1987 | Berglund et al. ........... 438/701 |
| 4,729,815 A | | 3/1988 | Leung |
| 4,784,720 A | | 11/1988 | Douglas |
| 4,790,903 A | | 12/1988 | Sugano et al. |
| 4,795,529 A | | 1/1989 | Kawasaki et al. |
| 4,844,767 A | | 7/1989 | Okudaira et al. |
| 4,983,253 A | * | 1/1991 | Wolfe et al. ................. 438/719 |
| 4,985,114 A | * | 1/1991 | Okudaira et al. ............. 216/37 |
| 5,435,886 A | | 7/1995 | Fujiwara et al. |
| 5,501,893 A | | 3/1996 | Laermer et al. |
| 5,637,189 A | * | 6/1997 | Peeters et al. .............. 438/466 |
| 5,716,534 A | | 2/1998 | Tsuchiya et al. |
| 5,759,921 A | * | 6/1998 | Rostoker ..................... 438/719 |
| 5,779,926 A | | 7/1998 | Ma et al. |
| 5,807,789 A | * | 9/1998 | Chen et al. ................. 438/714 |

FOREIGN PATENT DOCUMENTS

| | | |
|---|---|---|
| DE | 19706682 A1 | 12/1995 |
| DE | 4420962 A1 | 8/1998 |
| EP | 0822582 A2 | 2/1998 |
| WO | WO 99/10922 | 3/1999 |

* cited by examiner

*Primary Examiner*—Benjamin L. Utech
*Assistant Examiner*—Duy-Vu Deo
(74) *Attorney, Agent, or Firm*—Sughrue Mion, PLLC

(57) ABSTRACT

A method of plasma etching of silicon that utilizes the plasma to provide laterally defined recess structures through a mask. The method is based on the variation of the plasma parameters to provide a well-controlled anisotropic etch, while achieving a very high etch rate, and a high selectivity with respect to a mask. A mixed gas is introduced into the vacuum chamber after the chamber is evacuated, and plasma is generated within the chamber. The substrate's surface is exposed to the plasma. Power sources are used for formation of the plasma discharge. An integrated control system is used to modulate the plasma discharge power and substrate polarization voltage levels.

13 Claims, 2 Drawing Sheets

METHOD OF ANISOTROPIC ETCHING OF SUBSTRATES

BACKGROUND OF THE INVENTION

1. Field of the Invention

The invention relates to a method of anisotropic plasma etching of substrates preferably defined with an etching mask in which the etch rate and selectivity is increased. The method can be well implemented for manufacturing microelectromechanical system (MEMS), as well as microelectronic devices.

2. Background of the Related Art

Anisotropic plasma etching, particularly for single crystal silicon, can work independent of crystal orientation of the substrate or doping level. This method also applies to doped or undoped polysilicon. Preferred fields of applications are MEMS technology, where structures have a high aspect ratio, i.e., a high structural height to width ratio. Other examples include surface wave technology, where narrow grooves and vertical walls are etched to produce actuators, surface wave filters, delay lines, etc. Additional microelectronics applications include storage cells, insulation, collector contacts, etc.

The Reactive Ion Etching (RIE) processes which are commonly used for anisotropic silicon etch employ relatively high energy ions ($\geq 100$ eV) and reactive halogens, such as fluorine, chlorine or bromine, which are used directly in the plasma or are released from corresponding compounds, like $CF_4$, $CF_3Br$, $C_2F_6$, $CCl_4$, $CHCl_3$. The resulting ion bombardment of the etching ground, i.e., the area to be etched, initiates the reaction of the radicals with the silicon to be depleted. The etching of the sidewalls is minimal due to the directionality of the ions.

Problems occur when, to increase the speed of silicon removal (i.e., the etch rate), one tries to enhance the plasma density by increasing the power coupled to the plasma discharge. This can be accomplished by either increasing the power of the source for the plasma discharge or by increasing the value of the polarization voltage applied to the substrate. However, as the power is increased more hot ions are produced and the direction of ion movement becomes more random. The results is that more ions and radicals are depleted by the walls of the trenches, with the inevitable loss of anisotropy of the etch. To overcome this problem, one must reduce the etch rate, resulting in the loss of the throughput.

An additional problem encountered is mask degradation. As etch rate is reduced, etch time, and therefore mask exposure time, are increased, leading to more rapid mask degradation, i.e., reduced selectivity.

U.S. Pat. No. 5,501,893 discloses an etching method that includes alternating etching and polymerizing steps where the purpose of the polymerizing step is to provide a polymer layer on the surfaces that were exposed in the previous etching step to form a temporary etch stop. Thus the side walls are protected from etching during the etching steps. However, the gas mixtures introduced during the etching and polymerizing steps are different such that different gas mixtures are cycled during the respective etching and polymerizing steps. In the etching step the gas mixture includes $SF_2$ and Ar and in the polymerizing step the gas mixture includes $CHF_3$ and Ar.

The problem with cycling different gases is that the time ratio of the etch deposition cycle depends on the speed of the gas mixtures and varies from point to point, affecting the uniformity. Also, the time for species to arrive at the bottom of the etched trench varies drastically for trenches having different sized openings. Also, this method typically requires more complex hardware and controls to introduce the two different gas mixtures in cycles.

It is desirable to make the plasma as cold as possible with coexisting polymer-producing unsaturated monomers and fluorine, bromine or iodine radicals. The energy level sufficient for ionization is different for each gas. In certain cases, the activation energy for polymer-producing gases ($C_4F_8$, $CHF_3$) is two times higher than for radical producing gases ($SF_6$). The object of the invention is to establish a method for enhancing the treatment of the silicon surface being etched, by using the differences in the energies of activation of the reactive gases to arrive at optimal conditions for both etching and passivation, and alternating those conditions at a high rate to produce a high aspect ratio, and high selectivity etch process.

SUMMARY OF THE INVENTION

The object of the present invention is accomplished by providing a method of anisotropic plasma etching of substrates (typically silicon) comprising the following steps:

a) placing the substrate with the surface to be selectively etched on an electrode connected to an electromagnet power source;

b) introducing mixed gases consisting of an etching gas ($SF_6$) and a passivation gas ($CHF_3$, $C_4F_8$, etc.) into the processing chamber;

c) exciting the mixed gases with lower power (100–800 W) electromagnetic radiation sufficient to produce a plasma containing ions and radicals for etching;

d) concurrent with step (c), applying high polarizing voltage (50–500 eV) to the substrate via its electromagnet power source to produce a highly anisotropic etch;

e) exciting the mixed gases with high power (1000–3000 W) electromagnetic radiation to produce in the plasma unsaturated monomers for protective polymer coating formation;

f) concurrent with step (e), applying low polarizing voltage (0–25 eV) to the substrate to form a conformal polymer coating on the exposed side walls of the surfaces being etched; and alternating steps c) and d) with steps e) and f) to achieve an anisotropic etch with a high etch rate and selectivity than is currently being achieved using other methodologies.

The method used in this invention enables the substrate to be etched without using helium gas as a cooling medium. This is because lower power is used to excite the etching gas resulting in less heat being generated during the process.

A further advantage of this invention is that a constant flow of mixed gas is injected into the process chamber during processing, resulting in a process that is more stable and repeatable.

BRIEF DESCRIPTION OF THE DRAWINGS

The invention is described in detail below in conjunction with the attached drawings in which.

DESCRIPTION OF THE PREFERRED EMBODIMENT

Figure 1:
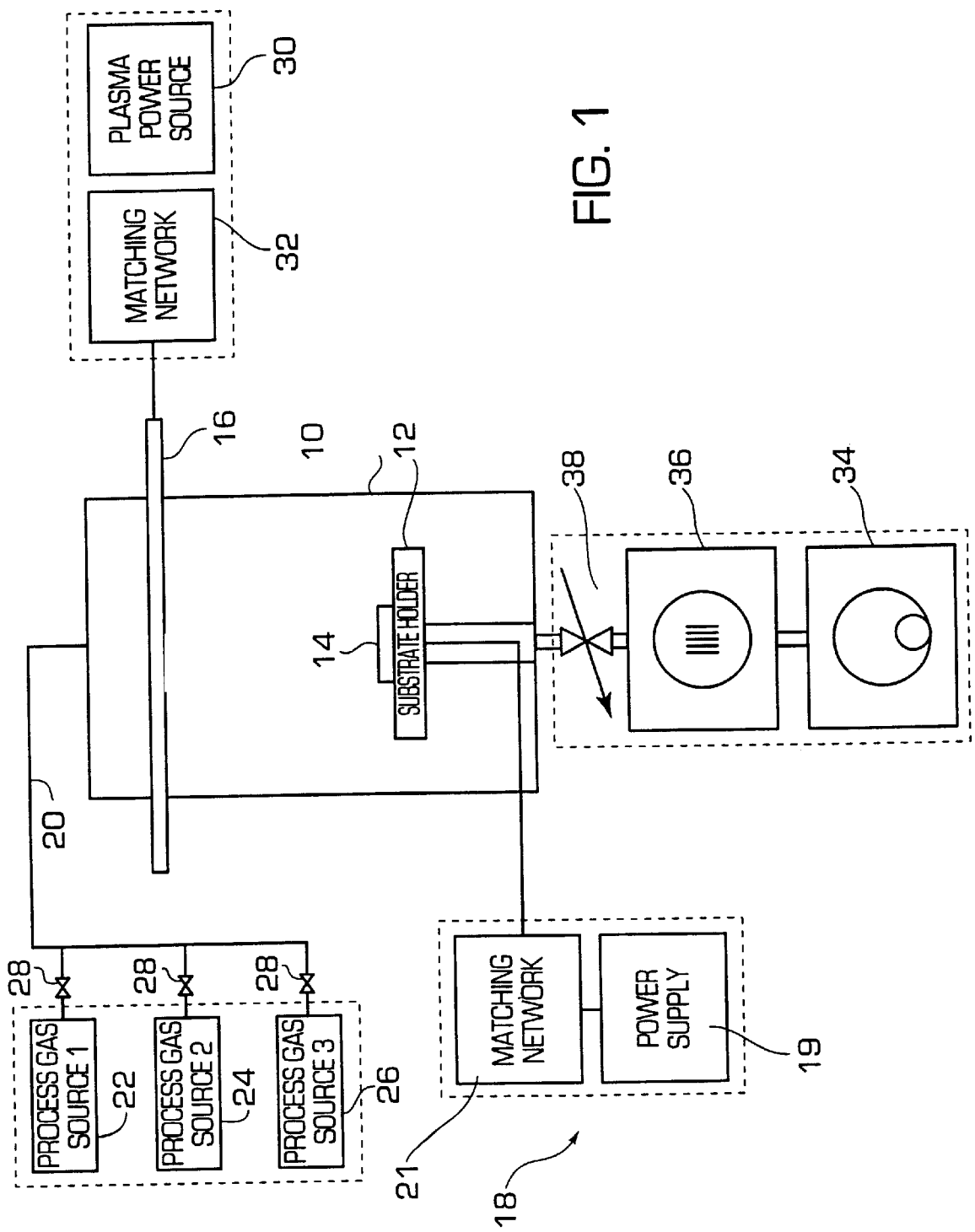
FIG. 1 is a schematical view showing the etching device for use in the present invention.

The following is a detailed description of the invention with reference to FIGS. 1 and 2(a) to 2(c). Referring to FIG. 1, the device includes an etching chamber 10. Provided within the chamber 10 is a substrate holder 12 for holding substrate 14 as well as an inductive coupler 16 provided near the top of the chamber 10. The substrate holder 12 is an electrode which is electrically connected to generator 18, including a power supply 19 and a matching network 21, for polarizing the substrate 14. Located at the top of the chamber is an inlet line 20 for introducing process gases into the chamber. The process gases are stored in gas tanks 22, 24 and 26. The flow rate of the process gases into the chamber 10 is controlled by a control valves 28. The plasma stimulation is provided by inductive coupler 16 powered by an RF power source 30 and an associated matching network 32. Pressure within the chamber 10 is controlled by mechanical pump 34, turbo-molecular pump 36 and throttle valve 38, in the conventional manner. It is of course understood that the invention is not limited to this particular device.

Figure 2A:
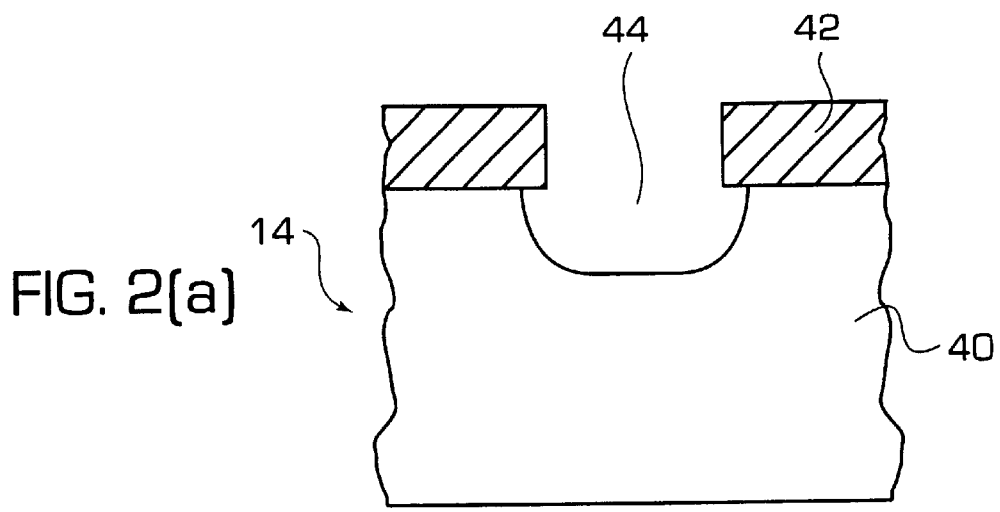
FIGS. 2(*a*) to 2(*c*) are views showing the process steps of the present invention.
Figure 2B:
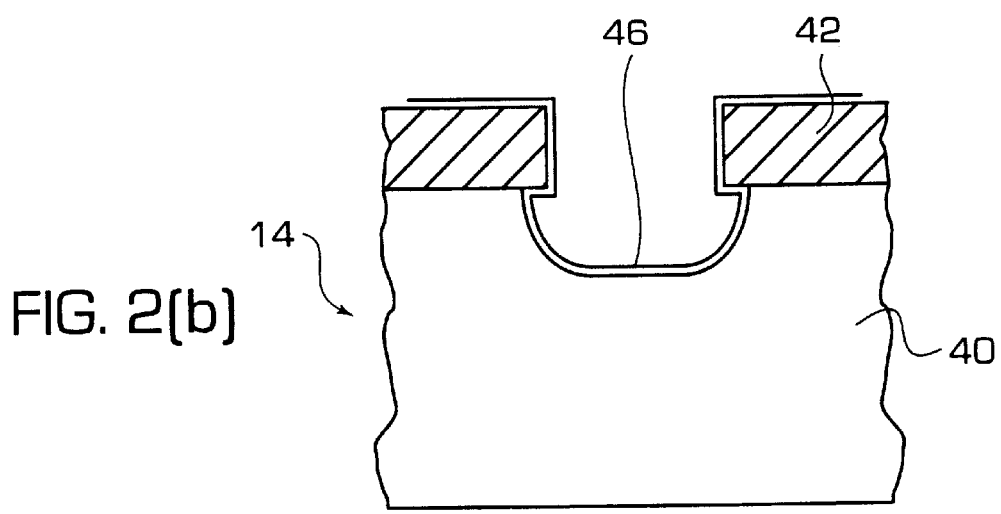
Figure 2C:
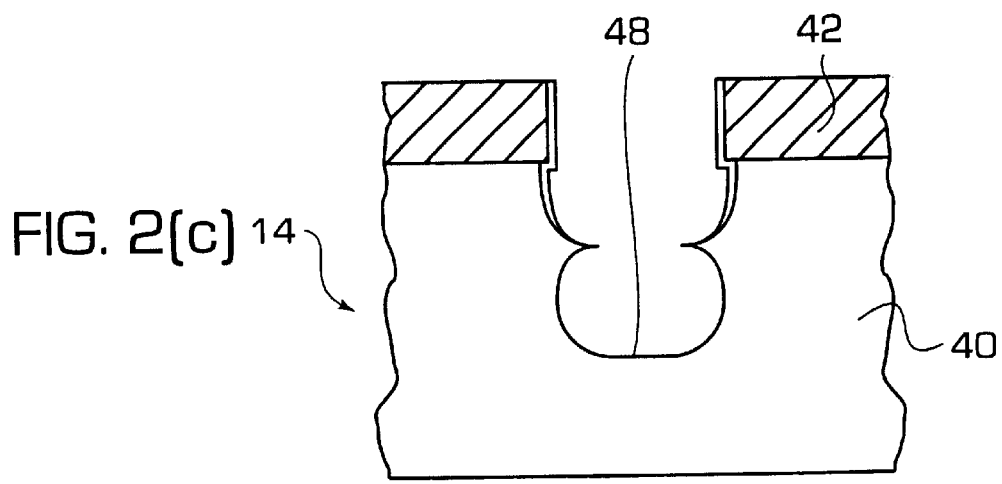

The following is a description of the process of etching the substrate with reference to FIGS. 2(a) to 2(c). The substrate 14, including a silicon substrate 40 and an etching mask 40 that exposes the regions of the silicon substrate 40 that are intended to be anisotropically etched, is placed on the substrate holder/electrode 12 and subjected to the first etching step. In this step, a mixture of gases containing etchant and passivating gases (e.g., $SF_6$, $C_4F_8$, and $CHF_3$) with a certain flow rate, preferably in the range of 100 to 400 sccm and pressure in the range of 0.1 to 10 Pa, is introduced into the chamber 10. The plasma is stimulated by applying a relatively low RF power, preferably in the range of 100 to 800 W, from the power source 30. At the same time, a polarization potential is provided by the substrate generator 18 to produce an electrical field of a relatively high value in the range of 50 to 500 eV, and preferably 80–300 eV. The low RF power applied for plasma stimulation provides the directional etch with an extremely high rate. Specifically, the plasma is "cold" due to the low energy applied so that the directionality of the ions can be controlled. Also, the high potential of the substrate 14 provides strong acceleration of the ions toward the etched surface. Both factors provide excellent directionality of the ions, resulting in a high anisotropic etch. The etched portion 44 of the silicon substrate 40 is shown in FIG. 2(a).

After a certain period of time, e.g., 10 to 100 sec, the power source 30 switches to a relatively high power, preferably in the range of 1000 to 3000 W, to create high energy excitation of the plasma and the polarization potential developed by the substrate generator is reduced to a relatively low, or even zero, value (i.e. 0–25 eV). High energy excitation of the plasma creates a condition that results in the formation of a polymer layer 46. Further, isotropic movement of species causes the thickness of the polymer layer 46 on the bottom of the trench to be the same as the thickness on the sidewalls, as shown in FIG. 2(b). During this time, the low polarization on the substrate 14 prevents any etching. After a certain time, e.g., 0.5 to 3 sec, the protective polymer layer 46 of a predetermined thickness is formed on the trench walls, as shown in FIG. 2(b). This protective polymer layer 46 prevents erosion of the trench walls that were formed in the previous etching steps during the subsequent etching step, performed in the manner discussed above.

Specifically, during the next etching step the previously etched sidewalls remain protected by the polymer layer 46, while the polymer layer on the bottom of the trench is rapidly stripped by the anisotropic bombardment of the ions that are accelerated by the high polarizing potential, allowing the silicon at the base of the trench to be further etched, as identified by reference numeral 48 in FIG. 2(c). The etching and passivating steps are alternately repeated until the trench reaches the required depth.

There are several advantages of this process when compared to the conventional process discussed above. In particular, the continuous introduction of a constant mixture of gases according to the present invention results in a more even distribution of species. This provides better uniformity across the substrate. In contrast, in the conventional case, where gases are cycled, the time ratio of the etch/deposition cycle depends on the speed of the gases and varies from point to point, affecting the uniformity.

Further, when using the cycled gas method, the time for the species to arrive at the bottom of the etched trench varies drastically for trenches with different sized openings. This increases the variation in the depths achieved for trenches with different aspect ratios (Aspect Ratio Dependent Etch). In the present case where the gas mixture is constant, the gas composition will be uniform for trenches with different size openings. This also improves the uniformity (microloading effect).

Further, the method of the present invention provides very high selectivity to the mask material, due to the combination of low power used during the etch and low polarization voltage used during deposition.

Since numerous changes can be made without departing from the spirit of the invention, it is intended that all matter contained in the foregoing description and shown in the accompanying drawings shall be interpreted as illustrative and not in a limiting sense. For example, the invention is not limited to the list of etchant and passivation gases discussed above. Additional silicon etching gases include $CF_4$, $NF_3$, NF3HF, HBr, $CCL_4$, $CF_2Cl_2$, $CFCl_3$, $Br_2$, $Cl_2$, $I_2$, HCl, $ClF_3$ and $BCl_3$. Also, additional passivation gases include $CH_4$, $CH_2F_2$, $H_2$, $C_2H_4$, $C_3H_8$, $CH_3Br$, $C_2F_6$, $C_2F_4$, and $C_3F_6$.

In addition, the etch or passivation effect may be achieved by alternating the pressure in the chamber. Specifically, the polymer formation during passivation is effected by the pressure. The higher the pressure the stronger the polymer formation and hence the greater the degree of passivation. In contrast, the lower the pressure the weaker the polymer formation and hence the lower the degree of passivation. Similarly, an increase in pressure during etching increases the etching rate, while a decrease in pressure decreases the etching rate.

What is claimed:

1. An anisotropic etching process for etching a silicon substrate comprising the steps of:

introducing a mixed gas containing etchant and passivating gases into a chamber with the silicon substrate to be etched;

etching said substrate in the presence of said mixed gas by controlling excitation power and substrate bias during a first period of time to remove material from the surface of said substrate and thereby provide an exposed surface;

passivating said substrate in the presence of said mixed gas by controlling excitation power and substrate bias during a second period of time to cover said exposed surface with a polymer layer, wherein said mixed gas is the same during said etching and passivating steps; and repeating said etching step, wherein said introducing step includes the step of introducing $SF_6$, $C_4F_8$, and $CHF_3$ into the chamber.

2. The etching process of claim 1, further comprising the step of repeating said passive step.

3. The etching process of claim 1, wherein said etching step includes the steps of applying RF power to an inductive coupler disposed in said chamber in the range of 100 to 800 W and applying a voltage to said substrate to produce a substrate bias in the range of 50 to 400 eV.

4. The etching process of claim 3, wherein said passivating step includes the steps of applying RF power to an inductive coupler disposed in said chamber in the range of 1000 to 3000 W and applying a voltage to said substrate to produce a substrate bias in the range of 0 to 25 eV.

5. The etching process of claim 3, wherein said etching step is carried out for a period ranging from 10 to 100 seconds.

6. The etching process of claim 4, wherein said etching step is carried out for a period ranging from 10 to 100 seconds.

7. The etching process of claim 4, wherein said passivating step is carried out for a period ranging from 0.5 to 3 seconds.

8. The etching process of claim 5, wherein said passivating step is carried out for a period ranging from 0.5 to 3 seconds.

9. The etching process of claim 1, wherein a gas pressure in said chamber is in the range of 0.1 to 10 Pa.

10. The etching process of claim 1, further comprising the step of varying the pressure in said chamber.

11. The etching process of claim 1, wherein during said introducing step said mixed gas is introduced at a constant rate during said etching steps and said passivating step.

12. The etching process of claim 1, wherein said excitation power during the etching steps is lower than the excitation power during said passivating step.

13. The etching process of claim 1, wherein said substrate bias during said etching steps is lower that said substrate bias during said passivating step.

* * * * *